(12) United States Patent
Milazzo et al.

(10) Patent No.: US 6,407,594 B1
(45) Date of Patent: Jun. 18, 2002

(54) ZERO BIAS CURRENT DRIVER CONTROL CIRCUIT

(75) Inventors: Patrizia Milazzo, Messina; Gregorio Bontempo, Barcellona Pozzo di Gotto; Angelo Alzati, Bollate, all of (IT)

(73) Assignees: SGS-Thomson Microelectronics S.r.l., Agrate Brianza; Consorzio per la Ricerca sulla Microelectronica nel Mezzagiorno, Catania, both of (IT)

( * ) Notice: Subject to any disclaimer, the term of this patent is extended or adjusted under 35 U.S.C. 154(b) by 1685 days.

(21) Appl. No.: 08/621,767

(22) Filed: Mar. 22, 1996

Related U.S. Application Data

(63) Continuation of application No. 08/220,841, filed on Mar. 31, 1994, now abandoned.

(30) Foreign Application Priority Data

Apr. 9, 1993 (EP) .............................................. 93830159

(51) Int. Cl.[7] .......................... H03K 17/16; H03K 3/353
(52) U.S. Cl. .................... 327/112; 327/377; 327/544
(58) Field of Search ................................. 327/377, 376, 327/544, 108, 375, 109, 112, 142, 382

(56) References Cited

U.S. PATENT DOCUMENTS 3,597,638 A 8/1971 Havnbjerg (List continued on next page.)

FOREIGN PATENT DOCUMENTS

| EP | 0090423 | 10/1983 |
|----|---------|---------|
| EP | 036968 | 8/1989 |
| EP | 427 086 | 10/1990 |
| EP | 0398170 | 11/1990 |
| EP | 0535797 | 4/1993 |
| GB | 2257854 | 1/1993 |
| WO | 93/01656 | 1/1993 |

OTHER PUBLICATIONS

Patent Abstracts of Japan, vol. 010, No. 184 (E–415) Jun. 27, 1986 & JP–A–61 030 957 9Fuji Electric Co Ltd) Feb. 13, 1986 *abstract*.

Patent Abstracts of Japan, vol. 12, No. 167 (E–610)(3014) May 19, 1988 & JP–A–62 277 063 (Toshiba Corp) Dec. 1, 1987 *abstract*.

*Primary Examiner*—Toan Tran
*Assistant Examiner*—Terry L. Englund
(74) *Attorney, Agent, or Firm*—Lisa K. Jorgenson; Allen, Dyer, Doppelt, Milbrath & Gilchrist, P.A.

(57) ABSTRACT

Static current consumption in a low-side output drive stage is eliminated by employing a switch in series with a current generator that is employed for controlling the discharge process of the driving node (gate) of the output power transistor and by controlling the switch with the voltage that is present on the driving node of the out put power transistor.

37 Claims, 6 Drawing Sheets

U.S. PATENT DOCUMENTS

| | | |
|---|---|---|
| 4,000,412 A | 12/1976 | Rosenthal et al. |
| 4,216,388 A | 8/1980 | Wilson |
| 4,274,014 A | 6/1981 | Schade, Jr. |
| 4,429,270 A | 1/1984 | Davies et al. |
| 4,527,102 A | 7/1985 | Gotou |
| 4,572,970 A * | 2/1986 | Allen et al. .................. 327/483 |
| 4,658,190 A | 4/1987 | Miyazaki et al. |
| 4,746,871 A | 5/1988 | de la Plaza |
| 4,806,880 A | 2/1989 | Laws |
| 4,823,029 A | 4/1989 | Gabara |
| 4,879,522 A | 11/1989 | Mattfeld |
| 4,896,297 A | 1/1990 | Miyatake et al. |
| 4,906,056 A | 3/1990 | Taniguchi |
| 4,948,995 A * | 8/1990 | Takahashi ................... 327/142 |
| 4,980,576 A | 12/1990 | Rossi et al. |
| 5,157,351 A | 10/1992 | Carobolante |
| 5,191,269 A | 3/1993 | Carbolante |
| 5,204,562 A * | 4/1993 | Pace .......................... 327/382 |
| 5,237,222 A | 8/1993 | Koblitz et al. |
| 5,258,662 A * | 11/1993 | Skovmand .................. 327/544 |
| 5,267,201 A | 11/1993 | Foss et al. |
| 5,281,862 A * | 1/1994 | Ma ............................ 327/108 |
| 5,289,051 A | 2/1994 | Zitta |
| 5,306,965 A * | 4/1994 | Asprey ....................... 327/108 |
| 5,311,150 A | 5/1994 | Engbretson et al. |
| 5,365,118 A | 11/1994 | Wilcox |
| 5,376,832 A | 12/1994 | Gariboldi et al. |
| 5,434,533 A | 7/1995 | Furutani |

\* cited by examiner $T_{PLH} = T_{PHL}$
$T_f = T_r$

ZERO BIAS CURRENT DRIVER CONTROL CIRCUIT

This application is a continuation of application Ser. No. 08/220,841, filed Mar. 31, 1994 and now abandoned.

CROSS-REFERENCE TO RELATED APPLICATION

This application claims priority from European App'n 93830159.5, filed Apr. 9, 1993, which is hereby incorporated by reference.

BACKGROUND AND SUMMARY OF THE INVENTION

The present invention relates to output power stages employing a power switch for connecting to a ground node a load and wherein static power consumption within the driving circuit is substantially eliminated.

A circuit for switchingly connecting to ground (low-side driver) an external load employing a power switch has a basic diagram as shown in FIG. 1.

Commonly the power switch Pw is a transistor, and often an integrated DMOS transistor (which offers definite advantages over a bipolar junction transistor). The integrated transistor structure intrinsically contains a junction (diode) Dr through which, in case of reactive loads, transient currents may recirculate. The power transistor Pw constitutes the output stage and is controlled by a driving circuit which determines a state of conduction or of nonconduction of the transistor, according to a certain "duty cycle" (in most applications).

In this way, an output signal having an amplitude comprised between V1=Rdson*Id and Vh=H.V. is produced, where H.V. is the supply voltage to which the external load is connected, Rdson is the saturation resistance of the power transistor Pw, and Id is the current through the load.

In order to ensure a low voltage drop through the power transistor Pw when it is conducting, and therefore a low power dissipation, it is highly desirable to minimize the Rdson value. This is achieved by driving the power transistor with a (gate) voltage that is higher than the voltage that is necessary for switching-on the transistor. Normally, for a DMOS transistor such an overdrive voltage may reach about 10V, i.e. Vgs=10V, that may be equal to the supply voltage Vcc of the control circuit.

Moreover, the output signal (OUT) is often required to have certain slew-rate characteristics ($T_f$ and $T_r$) and delays ($T_{PHL}$ and $T_{PLH}$), as referred to the control signal (IN), controlled and equal to each other, as depicted in FIG. 2.

On the other hand, in order to switch-on the power transistor Pw, it is necessary to charge the capacitance of the driving node (gate node) up to a voltage that is higher than the threshold voltage Vth of the transistor. If, during a switch-on phase, driving is effected through a constant current generator I1 driven by the switching signal IN (FIG. 1), the gate voltage will have a diagram versus time as the one depicted in FIG. 3. Three different zones of operation of the power transistor may be distinguished, as determined by the actual input capacitance that varies from zone to zone.

In a first zone I of the characteristic, the gate voltage rises from Vgs=0V to Vgs=Vth. In this interval of time no current flows through the power transistor which remains in an off condition. The interval t0–t1 is defined as turn-on delay time $T_{PHL}$. After the instant t1, the power transistor starts to conduct and the voltage Vds across the power transistor drops from Vh to Vdson=V1.

In a zone II of the characteristic, normally referred to as the saturation zone, the ratio $\Delta Vds/\Delta Vgs$ is high and therefore the Miller effect becomes preponderant in determining the input capacitance as compared with the "physical" gate capacitance of the power transistor. Because of this, the driving current primarily charges the "Miller" capacitance while a negligible portion of it charges the Cgs capacitance between gate and source of the power transistor Pw, thus causing a negligible variation of the Vgs voltage. In fact, the gate voltage rises from the value Vgs=Vth to the value Vgs=Vs (Vs is also referred to as the operative voltage). The interval t1–t2 is defined as the fall time $T_f$.

In the zone III of operation, the gate capacitance charges completely to the voltage Vcc and the power transistor is fully on (low internal resistance).

Similarly, for switching-off the power transistor Pw, its gate capacitance is discharged through a constant current generator I2, which is functionally connected between the gate node of thee power transistor and ground and which is driven by a switching signal IN, in opposite phase with respect to the switch signal IN driving I1. During a "time off" phase phenomena similar to those that occur during the "turn-on" phase takes place, as depicted in FIG. 4. Also in this phase of operation in fact, the gate capacitance discharges through three distinct phases.

In a first phase or zone I of the characteristic, the gate voltage drops from the value Vgs=Vcc to the operative voltage Vgs=Vs, while the drain voltage remains at Vdson. This interval (t'0–t'1) is defined as the turn-off delay time $T_{PLH}$.

In a second region II of the characteristic, the voltage Vgs drops from Vs to the threshold voltage Vth and during this phase the power transistor Pw starts to carry less and less current until it switches-off completely. The duration of this interval (t'1–t'2) during which the drain voltage rises from V1 to Vh, is defined as the rise time $T_r$.

If the currents I1 and I2 have the same value, the rise time and the fall time are identical.

In order to have a large charge current (Ic) and a large discharge current (Is) of the gate capacitance of the power transistor Pw for achieving fast switching times, while employing control current generators I1 and I2 of relatively low value, a driving circuit as the one depicted in FIG. 5 is employed. In fact, the relationship that ties the currents Ic and Is to the currents ID1 and ID4 is of an exponential kind:

$Ic = n^* I_D 1 \exp R^* I_{D1}/Vt$ $Is = n^* I_D 4 \exp R^* I_{D4}/Vt$

If $I_D 1$ and $I_D 4$ are equal, the currents Ic and Is will be equal and so also the fall time and the rise time.

In practice, in a circuit as the one depicted in FIG. 5, the current $I_D 4$ is different from $I_D 1$. In fact, the MOS M1 and M2 operate with a constant Vgs, therefore the current $I_D 1 = I$, while the MOS M3 and M4 operates with a Vgs that varies because their source is not connected to a fixed voltage, but to the gate of the power transistor Pw, the voltage of which drops during a turn-off phase. Therefore, $I_D 4 \neq I$.

Commonly, in order to obviate to this drawback, the sources of M3 and M4 are connected to a fixed voltage, for example to the supply voltage Vcc, so that, the current mirror formed by M3–M4, generates the same current as the current mirror M1–M2. Such a known solution is depicted in FIG. 6, and a functional block diagram may be depicted as in FIG. 7.

In this circuit, the transistors M2 and M4 do not exactly operate under the same conditions. In fact, M4 operates always in a saturation zone, with Vgs1=constant and Vds1= constant=Vcc−2Vbe, and the transistor M2 operates in a saturation zone until Vds2=Vgs2-Vth and thereafter operates in a linear zone. When M2 operates in a linear zone, the gate voltage of the power transistor Pw has already risen, above the operative voltage Vs, therefore the transistor no longer operates in the zone II and therefore the drain of the transistor has already assumed the voltage Vh.

This circuit has a drawback represented by the fact that when the power transistor Pw is off, and therefore its gate voltage is Vgs=0V, a certain current consumption (drawn from the supply line Vcc) occurs and is given by the sum: $I2+I_{D4}$.

In integrated circuits where numerous driving stages of this type are present, such a static current consumption may reach intolerable levels.

A main objective of the invention is to provide an improved control circuit for a low-side driver stage that without penalizing speed and precision characteristics has a substantially null static current consumption.

This objective is reached with the driver circuit of the present invention, which is characterized by the presence of a switch capable of preventing any flow of current through the discharge current generator of the control node capacitance of the power transistor, when the latter is in an off state. Such a switch is controlled by the voltage present on the control node of the power transistor. In practice, the driving circuit of the invention has a null static consumption when the power transistor is off and an extremely low consumption which would be practically negligible, when the power transistor is on.

BRIEF DESCRIPTION OF THE DRAWINGS

The invention will be more easily understood through the following description of an important embodiment that is herein incorporated by express reference.

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 8:
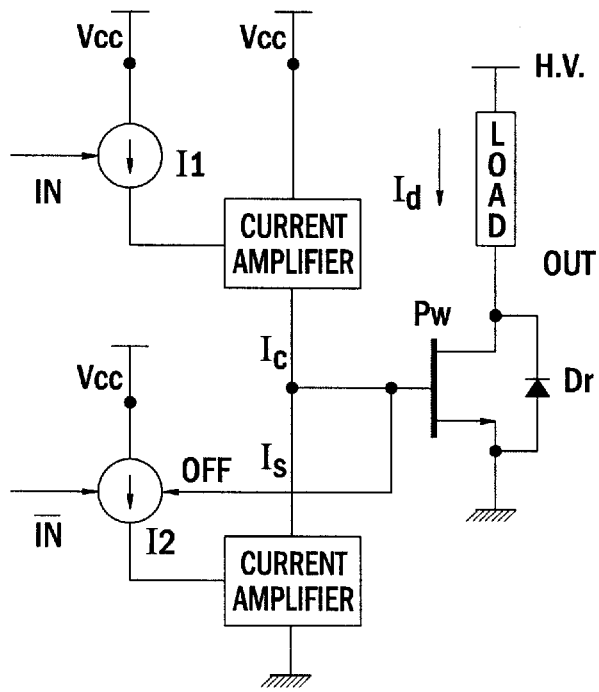
FIG. 8 is a block diagram of a driving circuit made in accordance with the present invention.

The numerous innovative teachings of the present application will be described with particular reference to the presently preferred embodiment (by way of example, and not of limitation), in which:

As schematically shown in FIG. 8, the driving circuit of the invention comprises a switch (OFF) capable of interrupting any current flow through the current generator 12 that is employed for discharging the capacitance of the control node (gate) of the output power transistor Pw. The switch (OFF) is controlled by the voltage present on the control node of the power transistor Pw and practically eliminates any (static) consumption of current when the power transistor Pw is off.

Figure 1:
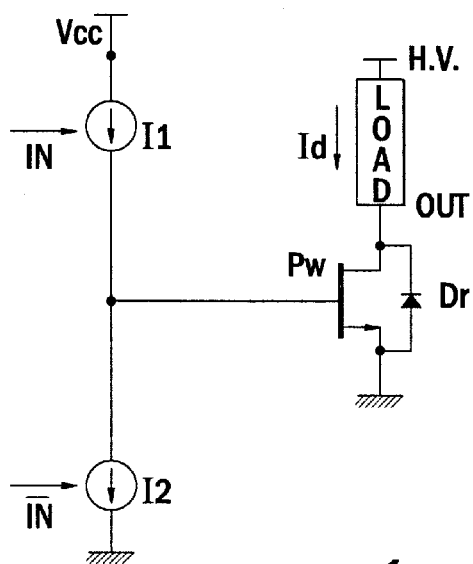
FIGS. 1, 2, 3, 4, 5, 6 and 7, as already described above, illustrate the state of the prior art.
Figure 2:
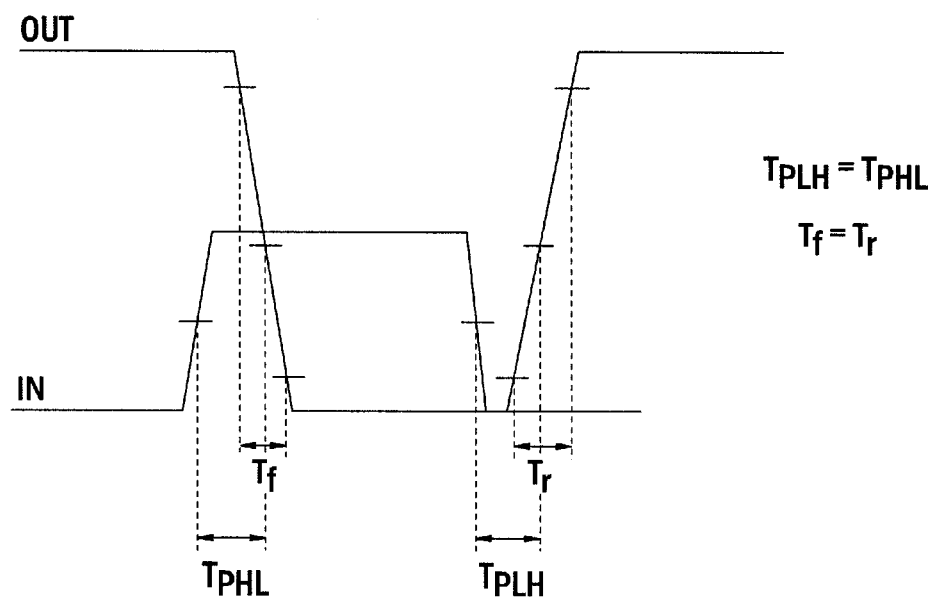
Figure 3:
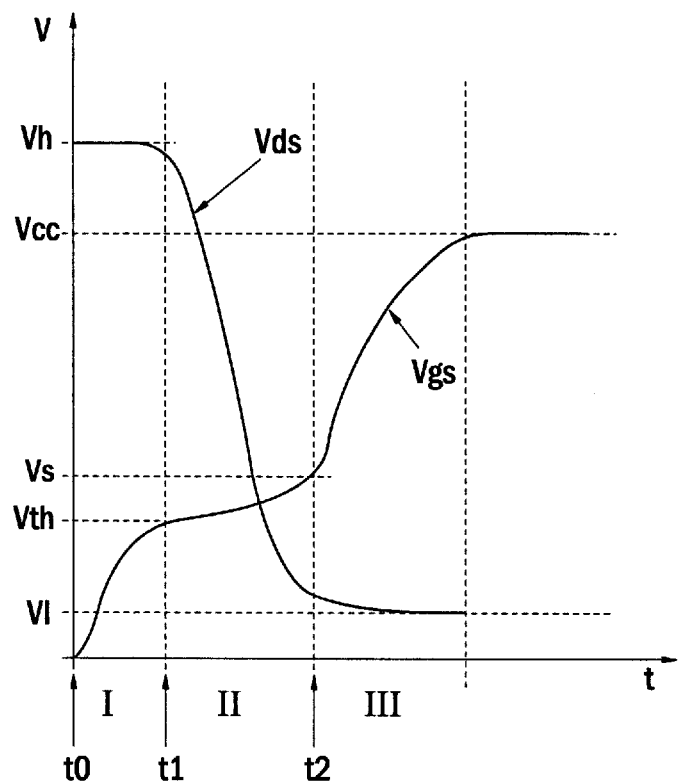
Figure 4:
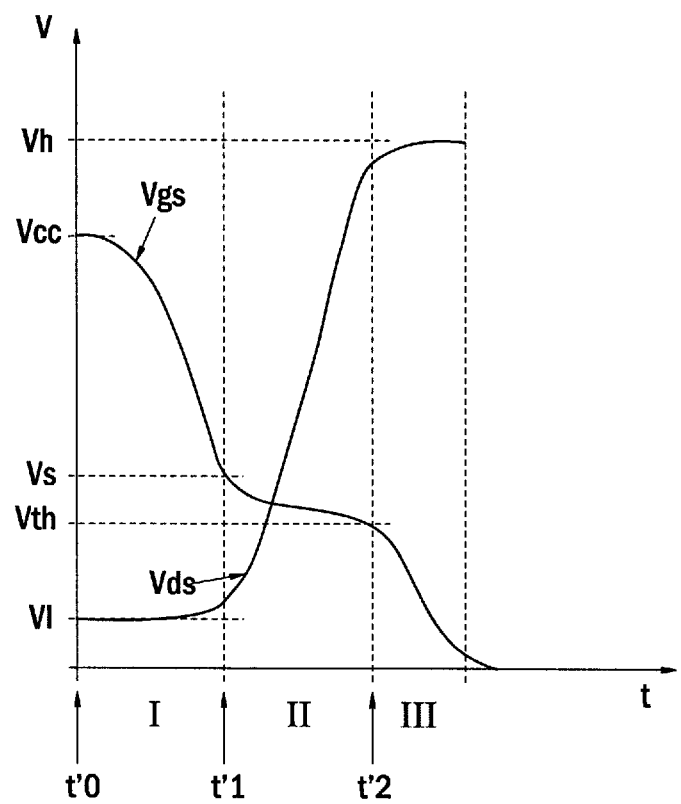
Figure 5:
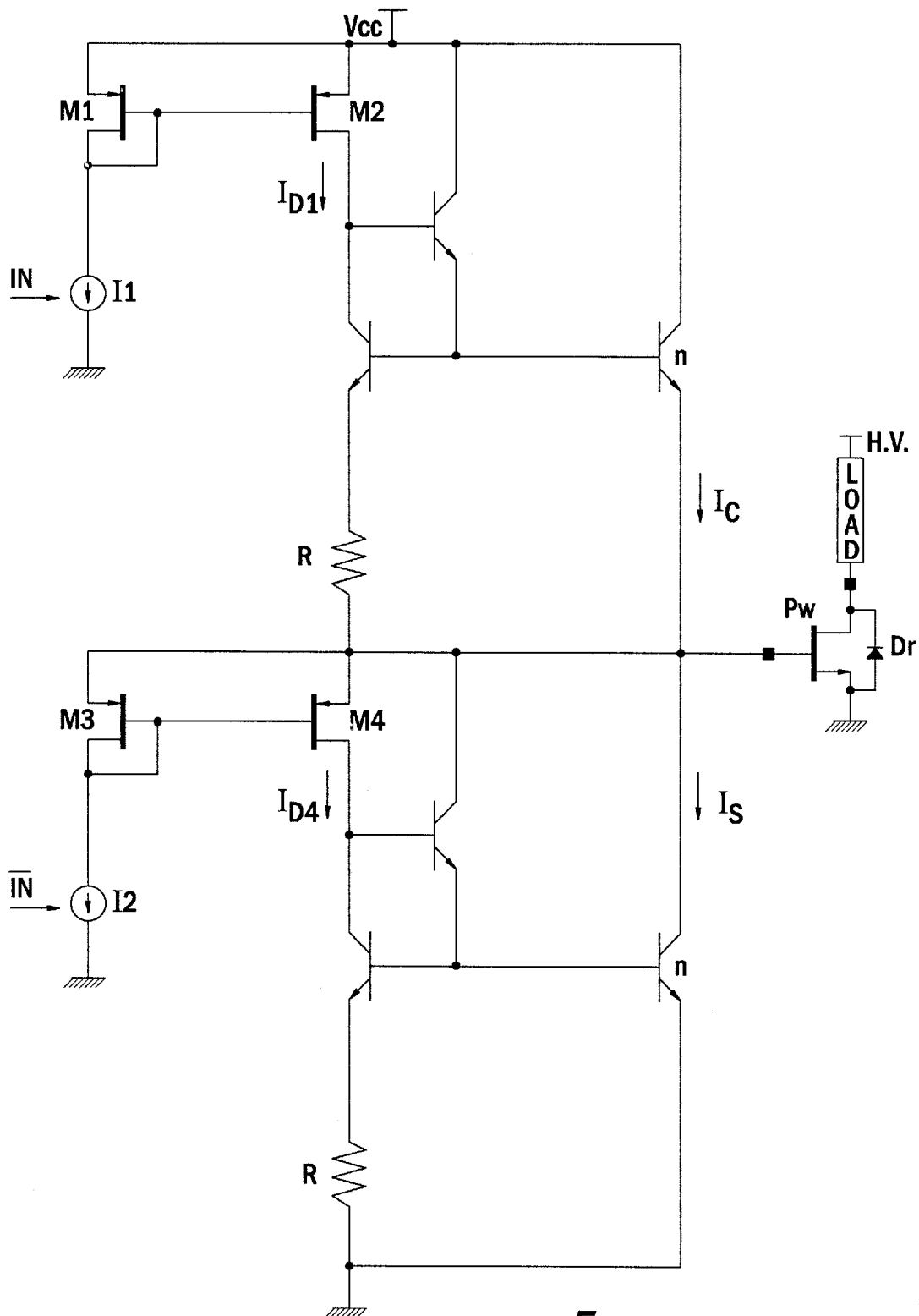
Figure 6:
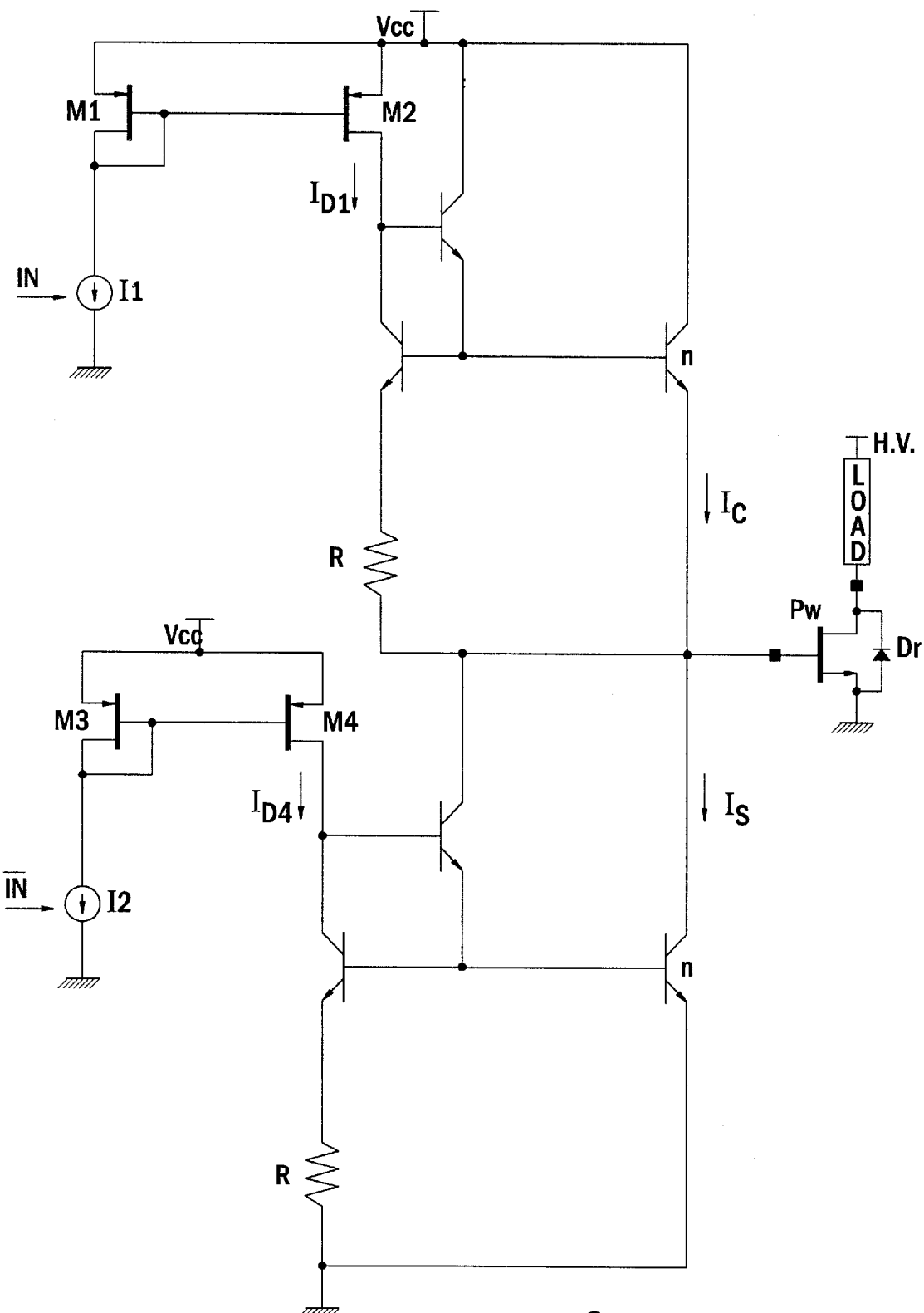
Figure 7:
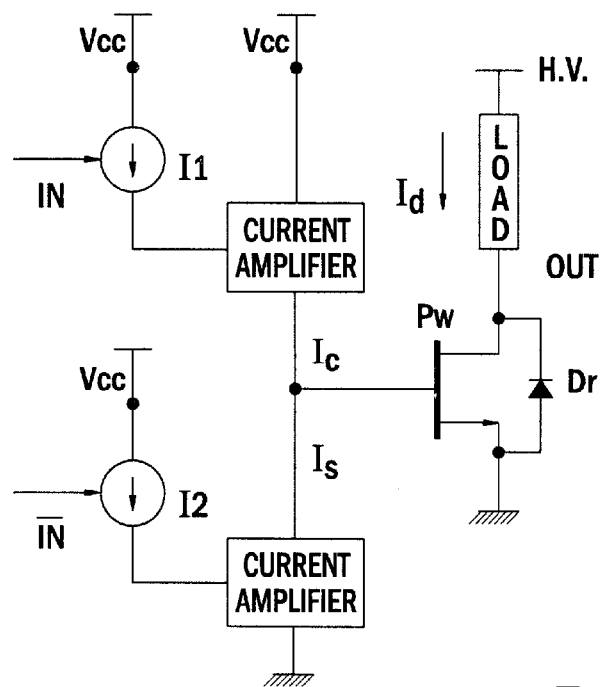
Figure 9:
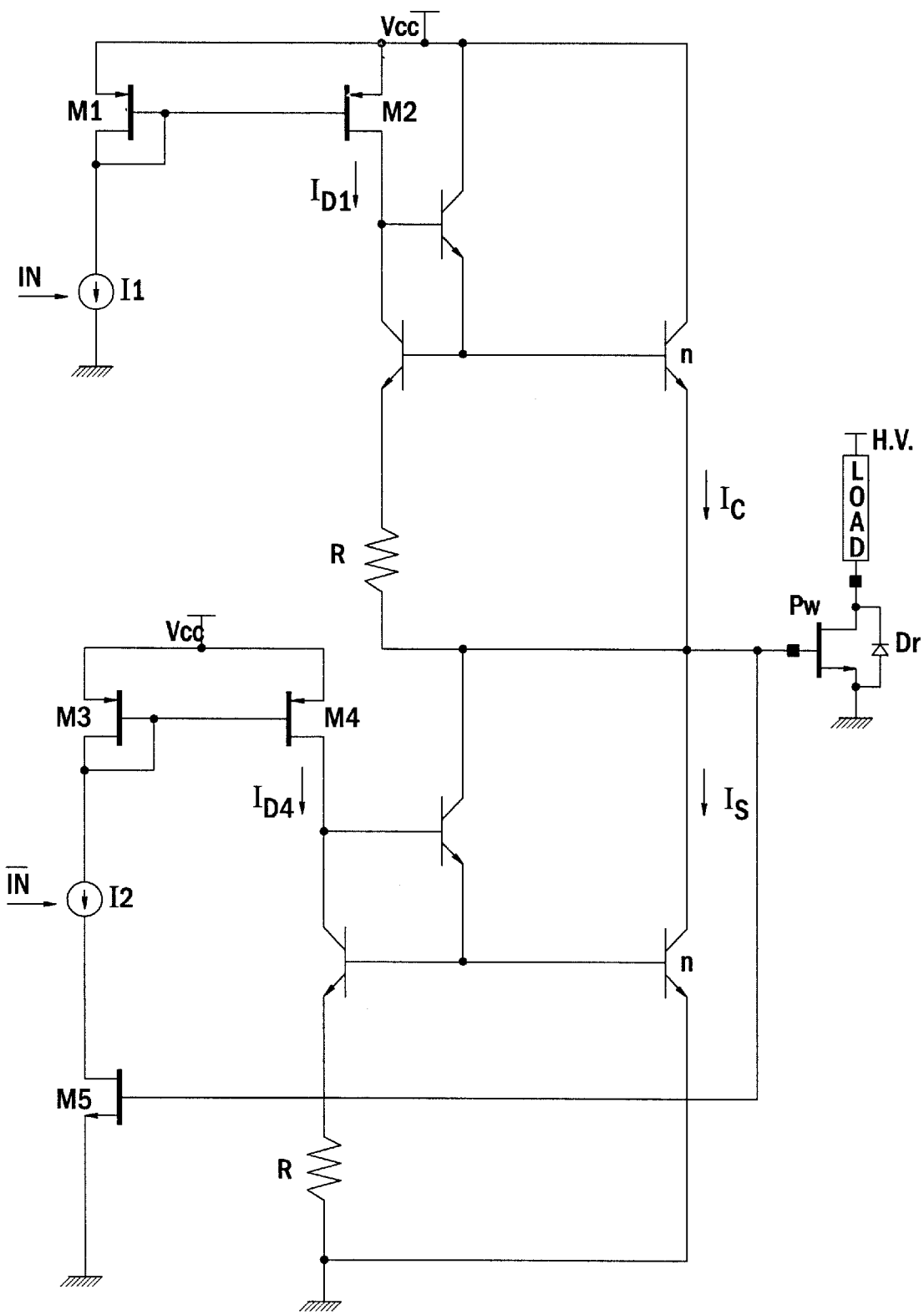
FIG. 9 is a driving circuit made in accordance with the present invention.

The electrical diagram of FIG. 9 shows an embodiment of the circuit of the invention in the case of a driving circuit which, under other aspects, may be entirely similar to the functional circuit of FIG. 6. The switch (OFF) of FIG. 8 is constituted by a MOS transistor M5 in the example shown.

When the power transistor Pw switches-off, while its gate voltage drops, also the gate voltage of the transistor M5 decreases.

In this switching-off phase, the resistance Rdson of the transistor M5 increases, thus causing a "mismatch" between the currents I1 and I2. By dimensioning the transistor M5 so that such a "mismatch" manifests itself in a significant manner when the power transistor Pw has already come out of saturation, the mismatch will not in practice represent any problem because the power transistor has already switched-off. Of course, the transistor M5 may be dimensioned in a way that its Rdson be practically negligible until the gate potential of the output power transistor has dropped to a value that has surely made the power transistor Pw exit a saturation condition. The size of M5 depends on the current level to be handled, which in turn depends on the design currents, I1, I2 provided by the current generators. The currents I1 and I2 may be set according to the particular application. Generally, they would be set at a level comprised between 10 and 100 $\mu A$. In a sample implementation, I1 and I2 would be 50 $\mu A$ and the dimensions of M5 (W/L) 55/7 $\mu m$.

Therefore, the transistor M5 behaves as a switch that opens when the gate voltage of the power transistor drops below the value of the threshold voltage of M5, thus interrupting the current flow in the branch I2 of driving circuit.

The introduction of a switch (M5) in series with the current generator (I2), does not modify other functional characteristics of the driving circuit, which retains its speed characteristics, moreover rise and fall times may remain identical to each other and more generally may be controlled. On the other hand the static consumption of current when the power transistor is off is totally eliminated. The circuit arrangement of the invention is simple to implement and requires a minimum additional area of integration.

The circuit of the invention could be also adapted for a driving circuit configured as a high-side driver. In this case (because the switch M5 has a source connected to ground potential and the gate connected to the gate of the power transistor), it would be necessary to employ a "level shifting" (down shifting) circuit between the driving node of the high-side driver and the gate of the switch M5, to have the switch M5 withstanding the gate voltage of the power transistor PW.

What is claimed is:

1. A low-side driver circuit, for use with an output power transistor having a threshold voltage, comprising:

a first current generator which is electrically coupled to receive and be controlled by a first switching signal, said first current generator being electrically coupled to said output power transistor to deliver a current, in response to said first switching signal, for charging a driving node of said output power transistor;

a second current generator electrically coupled to receive and be controlled by a second switching signal which is substantially complementary to said first switching signal, and to deliver a current, in response to said second switching signal but not said first switching signal, for discharging said driving node of said output power transistor; and control circuitry electrically coupled to said second current generator and to said output power transistor, said control circuitry being connected to prevent passage of current through said second current generator when the output power transistor is not conducting, said control circuitry being controlled by a voltage at said driving node of said output power transistor.

2. The low-side driver circuit as defined in claim 1, wherein the output power transistor is an integrated DMOS transistor.

3. The low-side driver circuit according to claim 1, wherein said control circuitry comprises a MOS transistor electrically coupled in series between a first reference voltage and said second current generator.

4. A low-side driver circuit for use with a power transistor having a threshold voltage, comprising:
   a first current mirror electrically coupled to a first reference voltage, to a first current generator and to said power transistor, said first current mirror being driven by said first current generator which is controlled by a first switching signal, said first current mirror providing a current for charging a driving node of the power transistor;
   a second current mirror electrically coupled to said first reference voltage, to a second current generator, and to said power transistor, said second current mirror being driven by said second current generator which is controlled by a second switching signal which is substantially complementary to said first switching signal, and said second current mirror providing a current, in response to said second switching signal but not said first switching signal, for discharging the driving node of the power transistor; and
   a switch electrically coupled to said power transistor and to said second current generator and to a second reference voltage, said switch being controlled to interrupt current from said second current generator in direct dependence on the voltage at the driving node of the power transistor.

5. The driver circuit as defined in claim 4, wherein the power transistor is an integrated DMOS transistor.

6. The driver circuit as defined in claim 4, wherein said switch is a MOS transistor.

7. The driver circuit as defined in claim 4, wherein said first current mirror and said second current mirror are electrically coupled between said first reference voltage and said second reference voltage.

8. An integrated driver circuit, electrically coupled to a load, to drive said load, comprising:
   a power switch electrically coupled to said load to drive the load toward a first voltage potential;
   a first current generator electrically coupled to said power switch to activate said power switch via a first control current and to electrically couple the load to said first voltage potential, said first current generator being controlled by a first switching signal;
   a second current generator electrically coupled to turn off said power switch via a second control current, said second current generator being controlled by a second switching signal which is substantially complementary to said first switching signal, and not by said first switching signal; and
   a switch electrically coupled to be controlled in dependence on an operation status of said power switch and to shut off said second control current when said power switch is in an off condition.

9. The integrated driver circuit according to claim 8, wherein said power switch is a power transistor.

10. The integrated driver circuit according to claim 8, wherein said power switch is a DMOS transistor.

11. The integrated driver circuit according to claim 9, wherein said switch is a MOS transistor electrically coupled in series with said second current generator, said MOS transistor having a control node connected, in common with an input node of the power transistor to turn off when said power transistor is off.

12. The integrated driver circuit according to claim 11, wherein said MOS transistor is dimensioned so that an internal resistance of said MOS transistor has a relatively low value until said power transistor has reached a steady state off condition.

13. The integrated driver circuit according to claim 8, wherein said first voltage potential toward which the load is driven is a ground potential.

14. The integrated driver circuit according to claim 8, wherein said first voltage potential toward which the load is driven is a supply potential.

15. An integrated driver circuit electrically coupled to drive a load comprising:
   a power transistor electrically coupled to said load to drive the load toward a predefined voltage potential;
   a first current generator connected to produce a first control current, said first current generator being controlled by a first switching signal;
   a first current amplifier electrically coupled to said first current generator and to said power transistor, said first current amplifier receiving said first control current and accordingly producing a first amplified control current, which is connected to turn on said power transistor to thereby connect the load to said predefined voltage potential;
   a second current generator connected to produce a second control current, said second current generator being controlled by a second switching signal, which is substantially complementary to said first switching signal, and not by said first switching signal;
   a second current amplifier electrically coupled to said second current generator and to said power transistor, said second current amplifier electrically coupled to receive said second control current to produce a second amplified control current, which is connected to turn off said power transistor to thereby disconnect the load from said predefined voltage potential; and
   a switch electrically coupled in series with said second current generator between a ground node and a supply node, said switch controlled by a voltage at an input node of said power transistor and connected to turn off said second control current when said power transistor is in a steady state off condition.

16. The integrated driver circuit according to claim 15, wherein said power transistor is a DMOS transistor.

17. The integrated driver circuit according to claim 15, wherein said switch is a MOS transistor, having a control node connected, in common with said input node of the power transistor to turn off when the power transistor is off.

18. The integrated driver circuit according to claim 17, wherein said switch is a MOS transistor which is dimensioned so that an internal resistance of said MOS transistor has a relatively low value until the power transistor has reached a steady state off condition.

19. The integrated driver circuit according to claim 15, wherein said first current amplifier comprises a first current mirror and said second current amplifier comprises a second current mirror, said first current mirror electrically coupled between said first current generator and said power transistor, said second current mirror electrically coupled between said second current generator and said power transistor.

20. The integrated driver circuit according to claim 19, wherein said first current mirror and said second current mirror are each powered by said supply node.

21. The integrated driver circuit according to claim 19, wherein said first current mirror and said second current mirror comprise a plurality of MOS transistors.

22. The integrated driver circuit according to claim 15, wherein said predefined voltage potential toward which the load is driven is a ground potential.

23. The integrated driver circuit according to claim 15, wherein said predefined voltage potential toward which the load is driven is a supply potential.

24. An integrated driver circuit for connection to a load to be driven, comprising:
- a power transistor connected to drive the load towards a first voltage potential;
- a first current source connected to produce a first control current under control of a first switching signal, said first current source electrically coupled to said power transistor and to a first reference voltage and to a second reference voltage;
- a first current mirror connected to produce a first amplified control current to turn on said power transistor driving an input node of said power transistor to couple the load to said first voltage potential, said first current mirror powered by a supply voltage received via a voltage supply node, said first current mirror electrically coupled between said first current source and said power transistor and to said first reference voltage and to said second reference voltage;
- a second current source connected to produce a second control current, said second current source controlled by a second switching signal, which is complementary to said first switching signal, and not by said first switching signal, said second current source electrically coupled to said power transistor and to said first reference voltage and to said second reference voltage;
- a second current mirror connected to produce a second amplified control current to turn off said power transistor, said second current mirror powered by said supply voltage received via said voltage supply node, said second current mirror being electrically coupled between said second current source and said power transistor, and being electrically coupled to said first and second reference voltages; and
- a switch connected in series with said second current source between said first reference voltage and said second reference voltage, said switch being controlled by an input node voltage at said input node of said power transistor, and being electrically coupled between said second current source and said second reference voltage to selectably control the flow of current from said second current source to said second reference voltage in dependence on the state of said power transistor.

25. The integrated driver circuit according to claim 24, wherein said power transistor is a DMOS transistor.

26. The integrated driver circuit according to claim 24, wherein said switch is a MOS transistor, having a control node electrically coupled to said input node of the power transistor, said MOS transistor being connected to turn off when the power transistor is off.

27. The integrated driver circuit according to claim 26, wherein said MOS transistor is dimensioned so that an internal resistance of said MOS transistor has a relatively low value until the power transistor has reached a steady state off condition.

28. The integrated driver circuit according to claim 24, wherein said first and second current mirrors each comprise at least one MOS transistor.

29. The integrated driver circuit according to claim 24, wherein said first current mirror and second current mirror have respectively first and second input and output legs each comprising at least one active element and being all connected to said voltage supply node; said first and second input legs connected respectively to said first and second current sources, and said first and second output legs both connected to said input node of said power transistor.

30. The integrated driver circuit according to claim 29, wherein said active elements are MOS transistors.

31. The integrated driver circuit according to claim 24, wherein said first voltage potential toward which the load is driven is a ground potential.

32. The integrated driver circuit according to claim 24, wherein said first voltage potential toward which the load is driven is a supply potential of the circuit.

33. A method of controlling the static power consumption of a driver circuit which drives an output power transistor, comprising the steps of:
- in response to a control signal, turning off the output power transistor with a discharge current;
- sensing status of operation of the output power transistor to determine when the output power transistor has reached a steady state off condition; and
- automatically interrupting flow of said discharge current through the driver circuit, as soon as the output power transistor has reached the steady state off condition, with a switch.

34. The method according to claim 33, wherein the flow of said discharge current is selectably interrupted when the output power transistor has reached the steady state off condition.

35. The driver circuit of claim 7, wherein said first reference voltage is a positive supply voltage and said second reference voltage is ground.

36. The low-side driver circuit of claim 3, wherein said first reference voltage is ground.

37. The driver circuit of claim 4, wherein said first reference voltage is a positive supply voltage and said second reference voltage is ground.

* * * * *